(12) United States Patent
Guarda et al.

(10) Patent No.: US 12,711,857 B2
(45) Date of Patent: Aug. 18, 2026

(54) TRAFFIC SIMULATOR ADJUSTMENT

(71) Applicant: Fujitsu Limited, Kawasaki (JP)

(72) Inventors: Pablo Guarda, Pittsburgh, PA (US); Koichiro Niinuma, Pittsburgh, PA (US); Jiachao Liu, Pittsburgh, PA (US); Sean Qian, Pittsburgh, PA (US)

(73) Assignees: Fujitsu Limited, Kawasaki (JP); CARNEGIE MELLON UNIVERSITY, Pittsburgh, PA (US)

(*) Notice: Subject to any disclaimer, the term of this patent is extended or adjusted under 35 U.S.C. 154(b) by 71 days.

(21) Appl. No.: 18/791,147

(22) Filed: Jul. 31, 2024

(65) Prior Publication Data

US 2026/0038364 A1 Feb. 5, 2026

(51) Int. Cl.
*G08G 1/01* (2006.01)
*G06F 30/20* (2020.01)

(52) U.S. Cl.
CPC .......... *G08G 1/0125* (2013.01); *G06F 30/20* (2020.01)

(58) Field of Classification Search
CPC .................................................. G08G 1/0125
See application file for complete search history.

(56) References Cited

U.S. PATENT DOCUMENTS

| | | | | |
|---|---|---|---|---|
| 7,894,980 | B2 * | 2/2011 | Liu ................. | G08G 1/096827 340/995.13 |
| 8,537,145 | B2 * | 9/2013 | Cuende Alonso ..... | G01C 15/00 345/204 |
| 8,688,321 | B2 * | 4/2014 | Prakah-Asante ...... | G08G 1/166 180/170 |
| 9,390,621 | B2 * | 7/2016 | Cuende Alonso ....... | G08G 1/04 |
| 10,074,271 | B1 * | 9/2018 | Gubarev ............. | G08G 1/0129 |
| 2019/0266890 | A1 * | 8/2019 | Lei .................. | G08G 1/096716 |

OTHER PUBLICATIONS

Sakai, T. Seo, and T. Fuse. Traffic density estimation method from small satellite imagery: Towards frequent remote sensing of car traffic. 2019 IEEE Intelligent Transportation Systems Conference (ITSC). Auckland, New Zealand, 2019, pp. 1776-1781.

(Continued)

*Primary Examiner* — Michael A Berns
(74) *Attorney, Agent, or Firm* — Maschoff Brennan

(57) ABSTRACT

A method may include determining a number of vehicles depicted in one or more images of at least a portion of a transportation network. The method may include determining, from the one or more images, respective lengths of segments in the transportation network corresponding to individual vehicles of the vehicles depicted in the one or more images. The method may also include determining an observed traffic density and an observed network flow corresponding to the transportation network based on the number of vehicles and the respective lengths of segments. The method may include determining a traffic density estimation and a network flow estimation, using a traffic simulator. The method may additionally include adjusting the traffic simulator based on the observed traffic density, the traffic density estimation, the observed network flow, and the network flow estimation.

17 Claims, 4 Drawing Sheets

(56) References Cited

OTHER PUBLICATIONS

A. Ganji, M. Zhang, and M. Hatzopoulou. Traffic volume prediction using aerial imagery and sparse data from road counts. Transportation Research Part C: Emerging Technologies 141 (2022), p. 103739.

W. Ma, X. Pi, and S. Qian. Estimating multi-class dynamic origin-destination demand through a forward-backward algorithm on computational graphs. Transportation Research Part C: Emerging Technologies 119 (2020), p. 102747.

P. Guarda, M. Battifarano, and S. Qian. Estimating network flow and travel behavior using day-to-day system-level data: A computational graph approach. Transportation Research Part C: Emerging Technologies 158 (2024), p. 104409.

* cited by examiner

TRAFFIC SIMULATOR ADJUSTMENT

FIELD

The present disclosure generally relates to adjusting a traffic simulator.

BACKGROUND

A traffic simulator may be employed to help provide accurate, efficient, and/or reliable modeling of traffic flow and congestion. For example, a traffic simulator may facilitate the analysis of vehicle movements and interactions within a transportation network. Additionally or alternatively, a traffic simulator may be deployed in multiple different situations to help improve traffic management. For example, a traffic simulator may model the impact of a new infrastructure project on existing traffic patterns. As another example, a traffic simulator may be used to evaluate the impact on traffic delays and/or on safety of adjusting one or more traffic control conditions (e.g., timing of traffic signals, speed limits, lane closures, etc.).

The subject matter claimed in the present disclosure is not limited to embodiments that solve any disadvantages or that operate only in environments such as those described above. Rather, this background is only provided to illustrate example technology areas where some embodiments described in the present disclosure may be practiced.

SUMMARY

According to an aspect of an embodiment, a method may include determining a number of vehicles depicted in images of at least a portion of a transportation network. The respective lengths of segments in the transportation network corresponding to individual vehicles depicted in the images may be determined. An observed traffic density and/or an observed network flow corresponding to the transportation network may be determined based on the number of vehicles and the respective lengths of the segments. A traffic simulator may determine a traffic density estimation and/or a network flow estimation corresponding to the transportation network. The traffic simulator may be adjusted based on the observed traffic density, the traffic density estimation, the observed network flow, and/or the network flow estimation.

The objects and advantages of the embodiments will be realized and achieved at least by the elements, features, and combinations particularly pointed out in the claims. It is to be understood that both the foregoing general description and the following detailed description are explanatory and are not restrictive of the invention, as claimed.

BRIEF DESCRIPTION OF THE DRAWINGS

Example embodiments will be described and explained with additional specificity and detail through the use of the accompanying drawings in which.

DETAILED DESCRIPTION

Figure 1A:
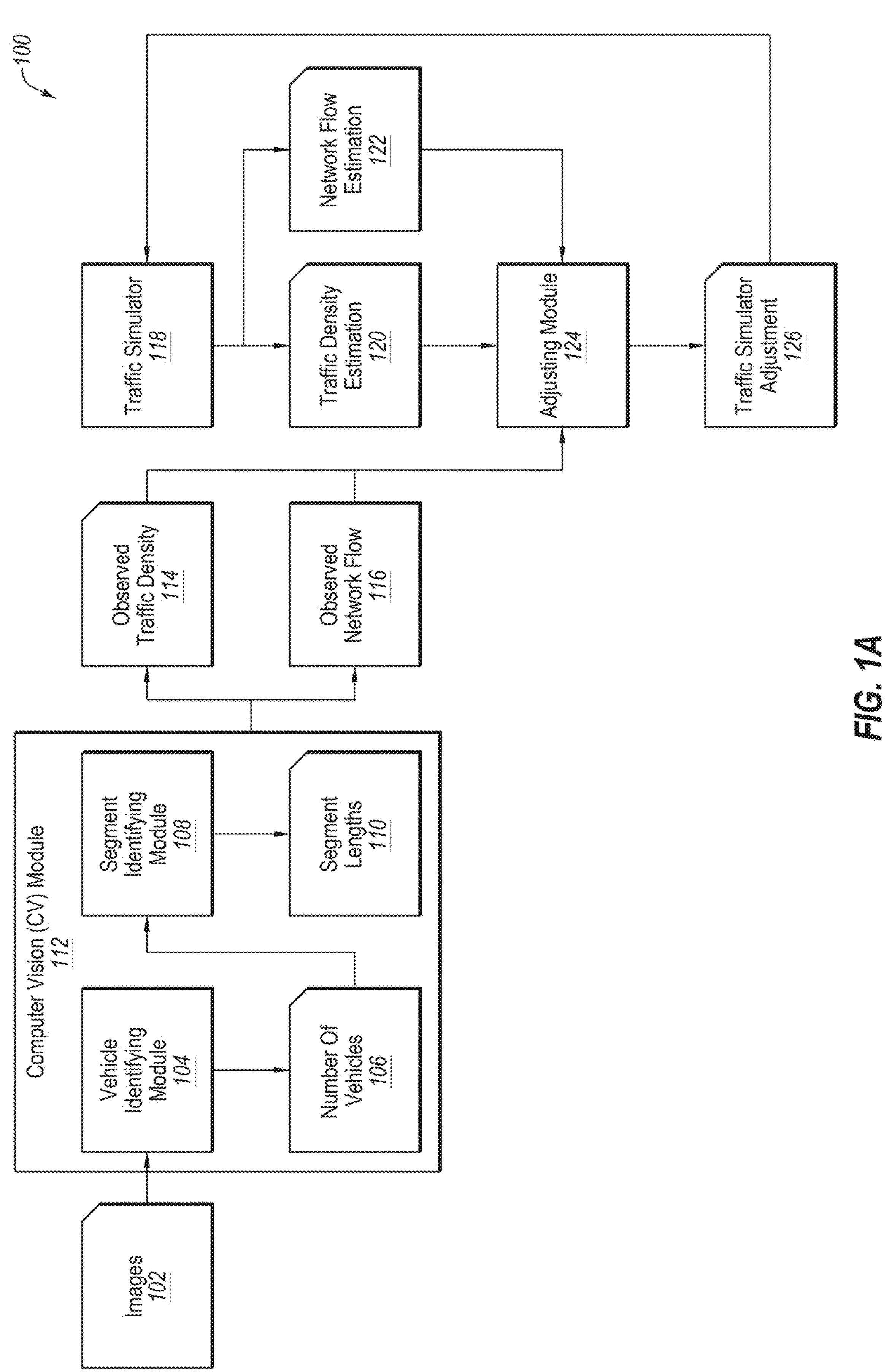
FIG. 1A illustrates an example embodiment of a system related to adjusting a traffic simulator.

A traffic simulator may be employed to model transportation networks. In some circumstances, traffic simulators may use images in the modeling of transportation networks, which may provide a relatively large amount of traffic information corresponding to a transportation network. Traffic simulators that utilize imagery (e.g., overhead imagery such as aerial and/or satellite imagery) may be more accurate and/or efficient than traffic simulators that model based on traditional traffic data sources (e.g., ground-based sensors such as loop detectors and probe vehicles) because traditional traffic data sources may be relatively difficult to obtain and/or sparse (e.g., provide limited spatial coverage) due to being costly and having high maintenance demands. Consequently, traffic simulators based on imagery may be used to improve urban planning, adjusting traffic control conditions (e.g., traffic signal timings, traffic calming measures, congestion pricing, etc.), managing emergency evacuations, etc. For example, a traffic simulator based on imagery may be used for monitoring and analyzing the impact of natural disasters on transportation networks, planning large-scale events, designing new infrastructure projects, and/or for other applications such as providing real-time traffic management solutions.

Traffic simulators using imagery may leverage artificial intelligence (AI) such as computer vision (CV). Parameters in an AI model may be adjusted to improve overall performance of the traffic simulator. By contrast, a traffic simulator not being adjusted for improved performance may be such that corresponding transportation networks may experience undesirable results such as increased traffic congestion and decreased safety. As the number of vehicles on the road increases, consequently causing traffic congestion in transportation networks to increase, changes to a traffic simulator may occur with greater frequency. An automated process for measuring such changes efficiently and generating the corresponding adjustments to implement improvements to overall traffic simulator performance may be helpful in improving the traffic simulators themselves and may be helpful in providing more accurate traffic simulations.

Adjusting a traffic simulator to get improved traffic simulating performance may be prone to error because of the relatively large number of traffic conditions and/or vehicles that may be included. For example, a transportation network may include hundreds, thousands, tens of thousands, or millions of vehicles in a given day. As traffic simulators are increasingly employed by transportation network managers, and as such traffic simulators account for more traffic conditions and/or vehicles, automated traffic simulator adjusting may be increasingly desirable.

The present disclosure may relate to, among other things, a method and a system to adjust a traffic simulator using a network flow estimation based on an image. Thus, traffic simulations of transportation networks may be improved by creating a method and system of automating traffic simulator adjustments according to the present disclosure. Automatically adjusting a traffic simulator based on a traffic density estimation and a network flow estimation may assist in ensuring that the traffic simulator operates at a desired accuracy level. Additionally or alternatively, adjusting a traffic simulator using imagery may provide a more flexible and comprehensive approach to simulating traffic dynamics across broader/larger geographical areas and/or over multiple time periods.

Embodiments of the present disclosure are explained with reference to the accompanying figures.

Turning to the figures, FIG. 1A illustrates an example embodiment of a system 100 configured to simulate a transportation network, arranged in accordance with at least some embodiments of the present disclosure. In some embodiments, the system 100 may be configured to simulate the transportation network based on images 102.

In some embodiments, the images 102 may include photographs and/or other representations generated using an optical sensor (e.g., a camera). For example, the images 102 may be an aggregation of photographs taken by various cameras in different locations so as to include data of a larger area. Additionally or alternatively, the images 102 may include multiple images of a single location taken over time. In some embodiments, the images 102 may include one or more overhead images of an area that is obtained from an elevated position such as from a location on a structure/building and/or using an aircraft, drone, satellite, etc. For example, the images 102 may include aerial images and/or satellite images. In some embodiments, the images 102 may include views of the Earth's surface (e.g., one or more roads in a transportation network). In some embodiments, the images 102 may include one or more videos and/or include images obtained from video. For example, the images 102 may include still photographs of the transportation network at different time points as captured in a video.

In some embodiments, the images 102 may be relatively high-resolution. For example, the images 102 may have a resolution of approximately 30-centimeters. Additionally or alternatively, the images 102 may include images with an average resolution of at least 200 pixels per inch (PPI) and/or at least 200 dots per inch (DPI). In some embodiments, the images 102 may offer extensive coverage and/or detailed insights into road networks and other infrastructure as well as traffic patterns on a scale unattainable with traditional traffic data collection methods.

In some embodiments, the images 102 may correspond to the transportation network (e.g., depict at least a portion of the transportation network). In some embodiments, the transportation network may include interconnected routes for the movement of people and/or goods. For example, the transportation network may include one or more routes included in a county, city, town, municipality, and/or geographical location of interest.

In these and other embodiments, the transportation network may include one or more links. In some embodiments, the one or more links may include a segment or portion of a transportation system that may connect/allow for travel between two or more points. For example, the links may include roads (e.g., highways, freeways, arterial roads, county roads, residential roads, boulevards, parkways, expressways, service roads, etc.). Additionally or alternatively, the links may be related to trains (e.g., commuter rail lines, light rail tracks, high-speed rail lines, freight train lines, etc.), related to pedestrians and/or bicyclists (e.g., sidewalks, footpaths, pedestrian crossings, trails, bike lanes, etc.), related to buses (e.g., bus lanes), related to water (e.g., rivers, lakes, canals, canal locks, ferry routes, ports, bridges, etc.), and/or related to other any other transportation mode/system (e.g., aircraft runways, airports/air fields, flight paths, and/or other aviation-related links). In some embodiments, the one or more links may each include a number of lanes, a length, and/or a capacity (e.g., the maximum number of vehicles per hour driven on that link). In some embodiments, the transportation network may include one or more links without corresponding ground-based traffic measurements (e.g., traffic counts, travel times computed at the link level, etc.). For example, a city-wide transportation network may include one or more roads where the speed of vehicles present on such roads is not regularly measured.

In some embodiments, the transportation network may be represented as a directed graph. For example, nodes of the transportation network may be intersections and/or the ends of roads and edges between the nodes may indicate the links (e.g., roads) of the transportation network that form such intersections. In some embodiments, the transportation network may be configured to be traversed by one or more vehicles including automobiles/cars, buses, trucks, motorcycles, scooters, bicycles, etc. Additionally or alternatively, the transportation network may be configured to be traversed by pedestrian traffic and/or one or more forms of public transportation (e.g., trains, trams, subways/metro systems, monorails, etc.).

In some embodiments, the images 102 may be obtained by a vehicle identifying module 104. In some embodiments, the vehicle identifying module 104 may be included in a computer vision (CV) module 112. In these and other embodiments, the vehicle identifying module 104 may include code and routines configured to cause performance of the operations described with respect to the vehicle identifying module 104. Additionally or alternatively, the vehicle identifying module 104 may be implemented using hardware including one or more processors, CPUs graphics processing units (GPUs), data processing units (DPUs), parallel processing units (PPUs), microprocessors (e.g., to perform or control performance of one or more operations), field-programmable gate arrays (FPGA), application-specific integrated circuits (ASICs), accelerators (e.g., deep learning accelerators (DLAs)), one or more programmable vision accelerators (PVAs), which may include one or more vector processing units (VPUs), one or more direct memory access (DMA) systems, one or more pixel processing engines (PPEs), etc., and/or other processor types. In these and other embodiments, the vehicle identifying module 104 may be implemented using a combination of hardware and software. In the present disclosure, operations described as being performed by the vehicle identifying module 104 may include operations that the vehicle identifying module 104 may direct a corresponding computing system to perform. In these or other embodiments, the vehicle identifying module 104 may be implemented by one or more computing systems, such as that described in further detail with respect to FIG. 3.

Figure 1B:
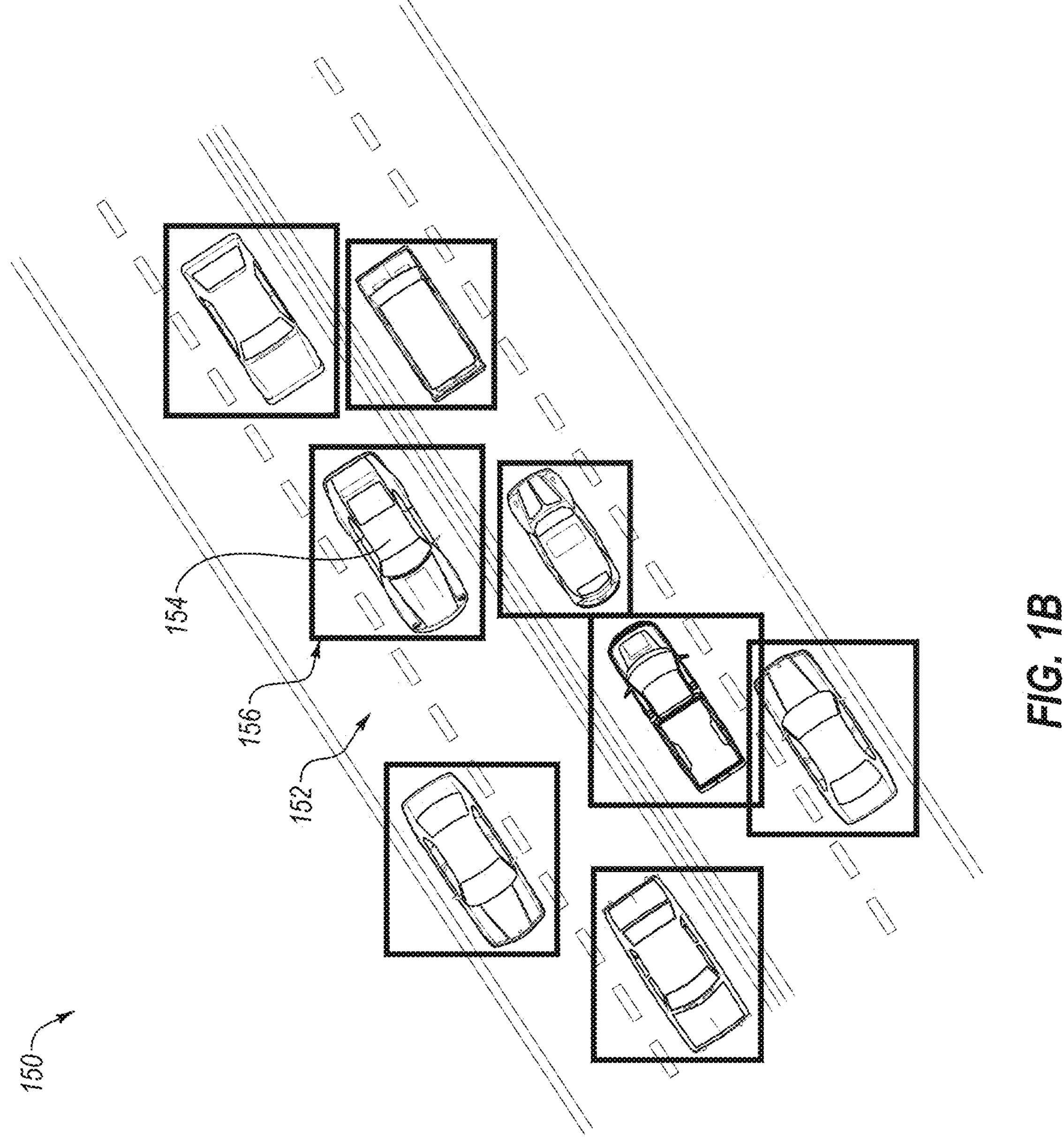
FIG. 1B illustrates an example vehicle identification.

In these and other embodiments, the vehicle identifying module 104 may determine the number of vehicles 106 present in one or more images of the images 102. For instance, the vehicle identification 150 of FIG. 1B may include an example result of determining the number of vehicles 106 depicted in an individual image. For example, in the vehicle identification 150, a link segment 152 with one or more vehicles 154 may be analyzed to determine how many vehicles 154 and/or where the vehicles 154 are located within the link segment 152. In some embodiments, the vehicle identification 150 may include creating/generating bounding shapes 156 (e.g., boxes/squares, circles/ovals, triangles, etc.) around/on top of the vehicles 154. In some embodiments, the bounding shapes 156 may then be counted/analyzed (e.g., via objection detection and/or another CV technique) to determine the number of vehicles 154. In some embodiments, the number of vehicles 154 and the length of the link segment 152 may be used to generate an observed traffic density.

Returning to FIG. 1A, in some embodiments, the vehicle identifying module 104 may apply a pre-trained object detector to the images 102 to identify vehicle locations. In some embodiments, the vehicle identifying module 104 may utilize one or more artificial intelligence (AI) models to identify the number of vehicles 106 present in each image of the images 102. For example, the vehicle identifying module

104 may use one or more CV techniques such as image classification, object detection, semantic segmentation, instance segmentation, panoptic segmentation, visual simultaneous localization and mapping (SLAM), etc. to determine the number of vehicles 106 that are depicted in an individual image. In some embodiments, the vehicle identifying module 104 may generate bounding shapes around/on top of identified vehicles in the images 102 such as seen in the bounding shapes 156 of the vehicle identification 150 illustrated in FIG. 1B. In some embodiments, the bounding shapes may be geolocated/geospatially matched using geographical information embedded in the images 102 (e.g., satellite images may generally contain embedded geographical information).

In some embodiments, the vehicle identifying module 104 may classify the type of vehicle as part of determining the number of vehicles 106. For example, the vehicle identifying module 104 may determine that an image includes 3,211 cars, 28 buses, and 54 trucks.

Additionally or alternatively, due to the relatively large number of pixels that may be present in an image of the images 102, the vehicle identifying module 104 may implement one or more objection detection algorithms on sliding windows. In some embodiments, object detection by the vehicle identifying module 104 (e.g., determining the number of vehicles 106 in an image) may include sliding windows of a size and/or other hyperparameters such as stride of the sliding windows and a threshold value for comparing against the intersection over union (IOU) metric obtained among overlapped data. For example, the vehicle identifying module 104 may determine the number of vehicles 106 present in an image by implementing object detection on sliding windows with an IOU threshold of approximately 10% and a stride of approximately 50% the size of the sliding windows. In some embodiments, the vehicle identifying module 104 may use one or more geospatial tools such as those to create bounding shapes marking detected vehicles in the images 102 such as the bounding shapes 156 illustrated in FIG. 1B. In some embodiments, the number of vehicles 106 may be obtained by (e.g., communicated/sent to) a segment identifying module 108.

In some embodiments, the segment identifying module 108 may determine segment lengths 110 in the transportation network corresponding to individual vehicles. In these and other embodiments, the segment identifying module 108 may be included in the CV module 112. In some embodiments, the segment identifying module 108 may apply one or more geospatial matching techniques and/or CV techniques to determine the segment lengths 110. In some embodiments, the segment identifying module 108 may determine segment lengths 110 based on the average length of a type of vehicle. For example, if the images 102 includes 870 cars and 11 buses and the average length of a car is approximately 14.7 feet (4.48 meters) and the average length of a bus is approximately 35 feet (10.67 meters), the segment lengths 110 may be approximately 13,174 feet (4,015 meters).

In some embodiments, the CV module 112 may include code and routines configured to cause performance of the operations described with respect to the CV module 112, the vehicle identifying module 104, and/or the segment identifying module 108. Additionally or alternatively, the CV module 112 may be implemented using hardware including one or more processors, CPUs graphics processing units (GPUs), data processing units (DPUs), parallel processing units (PPUs), microprocessors (e.g., to perform or control performance of one or more operations), field-programmable gate arrays (FPGA), application-specific integrated circuits (ASICs), accelerators (e.g., deep learning accelerators (DLAs)), one or more programmable vision accelerators (PVAs), which may include one or more vector processing units (VPUs), one or more direct memory access (DMA) systems, one or more pixel processing engines (PPEs), etc., and/or other processor types. In these and other embodiments, the CV module 112 may be implemented using a combination of hardware and software. In the present disclosure, operations described as being performed by the CV module 112 may include operations that the CV module 112 may direct a corresponding computing system to perform. In these or other embodiments, the CV module 112 may be implemented by one or more computing systems, such as that described in further detail with respect to FIG. 3.

In some embodiments, the number of vehicles 106 and/or the segment lengths 110 may be used by the CV module 112 to determine an observed traffic density 114. In some embodiments, the observed traffic density 114 may be determined for individual links and/or portions of links in the transportation network. For example, a link (e.g., the road corresponding to a city block) may include two lanes, one each for opposing directions of traffic, each approximately 300 feet (91.44 meters) in length such that if eight cars are identified (e.g., using CV) in an image of the link and determined to have segment lengths 110 of 128 feet (e.g., eight cars each approximately 16 feet (4.8 meters) in length), then the observed traffic density 114 may be 0.2133 (e.g., 21.33% of the road may be occupied by vehicles). Additionally or alternatively, the CV module 112 may compare the segment lengths 110 to the total length of links in a transportation network to determine the observed traffic density 114 for the transportation network as a whole. In some embodiments, the observed traffic density 114 may be based on vehicle types (e.g., as classified by the segment identifying module 108) of the number of vehicles 106. Additionally or alternatively, the observed traffic density 114 may be based on one or more ground-based measurements of traffic.

In some embodiments, the CV module 112 may determine an observed network flow 116. For example, the CV module 112 may determine the speed and/or the direction of a vehicle. For instance, based on two or more images of a vehicle traveling on a link at different time points, the CV module 112 may be able to determine the speed of the vehicle (e.g., in a first image, a car may be identified at a first point on a road and in a second image taken 1 second later, the car may be identified at a second point on the road that is 1 inch (2.54 centimeters) away from the first point in the image, corresponding to 88 feet (27 meters) on the road, which may be used to calculate that the vehicle is moving at a speed of 60 miles per hour (97 kilometers per hour)). As another example, the CV module may be able to determine the direction/movement of a vehicle based on which images of the images 102 in which the vehicle appears. For instance, a motorcycle may be identified in an image of an intersection at a first time point and then identified in an image of a road north of the intersection at a second time point, which may be used to determine that the motorcycle traveled north. In some embodiments, accuracy in determining the observed network flow 116 may be improved by including one or more estimations of traffic flow/counts and/or of vehicle speed based on images 102 (e.g., a video) collected relatively frequently (e.g., at least 24 frames per second or at least 60 frames per second) over a relatively extended time window (e.g., longer than one minute). In some embodiments, the CV module 112 may communicate (e.g., transmit or send) the observed traffic density 114 and/or the observed network flow 116 determined from the images 102 to an adjusting module 124 for a traffic simulator 118.

In some embodiments, the system 100 may include a traffic simulator 118. The traffic simulator 118 may include code and routines configured to cause performance of the operations described with respect to the traffic simulator 118. Additionally or alternatively, the traffic simulator 118 may be implemented using hardware including one or more processors, CPUs graphics processing units (GPUs), data processing units (DPUs), parallel processing units (PPUs), microprocessors (e.g., to perform or control performance of one or more operations), field-programmable gate arrays (FPGA), application-specific integrated circuits (ASICs), accelerators (e.g., deep learning accelerators (DLAs)), one or more programmable vision accelerators (PVAs), which may include one or more vector processing units (VPUs), one or more direct memory access (DMA) systems, one or more pixel processing engines (PPEs), etc., and/or other processor types. In these and other embodiments, the traffic simulator 118 may be implemented using a combination of hardware and software. In the present disclosure, operations described as being performed by the traffic simulator 118 may include operations that the traffic simulator 118 may direct a corresponding computing system to perform. In these or other embodiments, traffic simulator 118 may be implemented by one or more computing systems, such as that described in further detail with respect to FIG. 3.

In some embodiments, the traffic simulator 118 may be a mesoscopic simulator. For example, the traffic simulator 118 may address transportation network-wide traffic flow dynamics as well as choice behaviors of individual travelers within the transportation network. Alternatively, the traffic simulator 118 may be a microscopic simulator or a macroscopic simulator. In some embodiments, the traffic simulator 118 may simulate traffic based on one or more spatiotemporal data sources. For example, the traffic simulator 118 may use one or more of global positioning system (GPS) data, traffic sensor data, historical traffic data, incident reports, weather data, survey data, and/or any other type of spatiotemporal data to assist in simulating traffic. In some embodiments, the traffic simulator 118 may generate a traffic density estimation 120 and/or a network flow estimation 122.

In some embodiments, the traffic simulator 118 may be configured to determine the traffic density estimation 120 using any suitable technique. For example, the traffic simulator 118 may use one or more CV models such as a dynamic origin-destination demand estimation (DODE) model to determine the traffic density estimation 120. In some embodiments, the traffic simulator 118 may be configured to determine a network flow estimation 122. In these and other embodiments, the network flow estimation 122 may include an estimated or actual assessment of the movement of vehicles with the transportation network. In some embodiments, the network flow estimation 122 may be generated at the link level, path level, and/or origin-destination level. For example, the network flow estimation 122 may be an estimation of how vehicles on a road during a particular period will move (e.g., simulates how over time the number of vehicles present on a road may be the same, greater, or less than before).

In some embodiments, the system 100 may include an adjusting module 124. In some embodiments, the adjusting module 124 may be included in or implemented by any suitable computing system. For example, the adjusting module 124 may be implemented using hardware including one or more processors, central processing units (CPUs), graphics processing units (GPUs), data processing units (DPUs), parallel processing units (PPUs), microprocessors (e.g., to perform or control performance of one or more operations), programmable vision accelerators (PVAs)—which may include one or more direct memory access (DMA) systems and/or one or more vector or vision processing units (VPUs), field-programmable gate arrays (FPGA), application-specific integrated circuits (ASICs), accelerators (e.g., deep learning accelerators (DLAs)), and/or other processor types. Additionally or alternatively, the adjusting module 124 may be implemented using a combination of hardware and software. In the present disclosure, operations described as being performed by the adjusting module 124 may include operations that the adjusting module 124 may direct one or more corresponding computing systems to perform. In some embodiments, the adjusting module 124 may be configured to use the observed traffic density 114 to evaluate, compare, and/or validate the traffic density estimation 120. Additionally or alternatively, the adjusting module 124 may be configured to use the observed network flow 116 to evaluate, compare, and/or validate the network flow estimation 122. In these and other embodiments, the adjusting module 124 may be implemented by one or more computing systems, such as that described in further detail with respect to FIG. 3.

In some embodiments, the adjusting module 124 may determine/generate a traffic simulator adjustment 126. In some embodiments, the traffic simulator adjustment 126 may include instructions and/or weights that may be implemented/applied by the traffic simulator 118 to modify and/or calibrate one or more traffic simulation models of the traffic simulator 118.

In these and other embodiments, the traffic simulator adjustment 126 may be configured to increase performance of the traffic simulator 118. For example, the traffic simulator adjustment 126 may be configured to improve one or more key performance indicators related to transportation network simulations (e.g., accuracy, efficiency, relevancy, etc.). In some embodiments, the traffic simulator adjustment 126 may improve the ability of the traffic simulator 118 to simulate traffic conditions based on overhead images (such as aerial and/or satellite images corresponding to the images 102). In these and other embodiments, the traffic simulator adjustment 126 may be generated using the traffic density estimation 120 and the network flow estimation 122. For example, in some embodiments, the traffic simulator adjustment 126 may be based on reducing error in the traffic density estimation 120 and/or in the network flow estimation 122. In these and other embodiments, the reducing of the error may be based on performing one or more operations (e.g., a minimization operation, an optimization operation, etc.). For example, reducing error in the traffic density estimation 120 may include adjusting the traffic simulator 118 using a traffic simulator adjustment 126 such that the traffic density estimation 120 matches or comes within a specified/desired range of the observed traffic density 114. As another example, reducing error in the network flow estimation 122 may include adjusting the traffic simulator 118 using a traffic simulator adjustment 126 such that the network flow estimation 122 matches or comes within a specified/desired range of the observed network flow 116.

In some embodiments, the traffic simulator adjustment 126 may be based on a gradient-based optimization. For example, the adjusting module 124 may be calibrated using one or more of traffic density estimation error, network flow estimation error, and/or travel time estimation error. For instance, the adjusting module 124 may apply a loss function (e.g., Equation 1 below) such that the traffic simulator adjustment 126 may be generated based on the difference between predicted/simulated traffic behavior (e.g., the traffic density estimation 120 and/or the network flow estimation 122) and actual/desired traffic behavior (e.g., the observed traffic density 114 and the observed network flow 116). In some embodiments, the adjusting module 124 may determine the traffic simulator adjustment 126 to include one or more adjustments to have the traffic density estimation 120 match the observed traffic density 114. For example, the loss function may be used to train the parameters of one or more models included in the traffic simulator used to generate the traffic simulator adjustment 126 such that the error between predicted traffic behavior and actual traffic behavior may be minimized. For instance, the loss function may perform a minimization with respect to the differences between modeled traffic conditions and observed traffic conditions by accounting for parameters such as link traffic count, link travel time, and/or link density. In some embodiments, the loss function may still be used when one or more links in the transportation network may not have an available ground-based measurement.

(Equation 1)

$$\min_{\{q_m\}_m} \mathcal{L} = \underbrace{w_1\left(\left\| y - \sum_{m \in C} L_m \rho_m p_m q_m \right\|_2^2\right)}_{\mathcal{L}_1} + \underbrace{w_2\left(\left\| z - \sum_{m \in C} M_m \overline{\Lambda}(\rho_m p_m q_m) \right\|_2^2\right)}_{\mathcal{L}_2} + \underbrace{w_3\left(\left\| k - \sum_{m \in C} (N_m \rho_m p_m q_m - N_m \rho'_m p_m q_m) \right\|_2^2\right)}_{\mathcal{L}_3}$$

In some embodiments, y may be observed count, z may be travel time, and k may be the traffic density estimation 120. In some embodiments, $L_m$, $M_m$, and $N_m$ may be aggregation matrices used to map simulated traffic conditions to observed traffic conditions. In some embodiments, $w_1$, $w_2$, and $w_3$ may be parameters that weight the relative importance of reconstructing network flow, travel time, and traffic density, respectively. In some embodiments, m may represent vehicle class/type. In some embodiments, q may be a vector of origin-destination flow. In some embodiments, p may include one or more path choice probabilities.

Additionally or alternatively, the loss function may include one or more model constraints. For instance, the model constraints may include $\{h_m, \rho_m, \rho'_m\}_m = \Lambda(\{f_m\}_m)$; $f_m = p_m q_m$; $p_m = \Psi_m(\{c_m\}_m, \{h_m\}_m)$; and/or $q_m \geq 0$, $\forall m \in C$. In some embodiments, f may represent path flow. In these and other embodiments, Ψ may represent a route choice function and Λ may represent a dynamic network loading (DNL) function. In some embodiments, the route choice function may use path ($c_m$) and link travel cost ($h_m$) as input to determine route choice proportion ($p_m$). In some embodiments, the A function may load (e.g., have as an input) path flow ($f_m$) and may output the link travel time ($h_m$) and/or dynamic assignment ratio (DAR) matrices ($\rho_m$ and $\rho'_m$). In some embodiments, $\overline{\Lambda}$ may indicate the relationship between link arrival flow ($x_m = \rho_m p_m q_m$) and link travel time ($h_m$), which may be denoted by $h_m = \overline{\Lambda}(x_m)$.

In some embodiments, the traffic simulator adjustment 126 may be determined using a computational graph with one or more forward-backward algorithms. For example, a gradient-based solution algorithm may be used to solve the loss function (e.g., the dynamic origin-destination demand estimation (DODE)) on a computational graph. Thus, in some embodiments, a computing system, such as the computing system 300 described with respect to FIG. 3, may be used to determine (e.g., calculate or estimate) the traffic simulator adjustment 126.

In some embodiments, the traffic simulator adjustment 126 may be used to adjust the traffic simulator 118 (e.g., one or more parameters, algorithms, techniques, and/or models of the traffic simulator 118 may be adjusted). Adjusting the traffic simulator 118 may occur until a threshold is met and/or a condition is satisfied. For example, the traffic simulator 118 may be adjusted based on the traffic simulator adjustment 126 until the error in the traffic density estimation 120 as compared to the observed traffic density 114 and/or in the network flow estimation 122 as compared to the observed network flow 116 are within a specified/desired range.

Accordingly, in some embodiments, the system 100 may be configured to adjust the traffic simulator 118, thereby improving the traffic simulating of a transportation network. In some embodiments, the system 100 may improve the accuracy of the traffic simulator 118 (e.g., by using the observed traffic density 114 and the observed network flow 116 obtained using CV on the images 102 and using the traffic density estimation 120 and the network flow estimation 122 to determine the traffic simulator adjustment 126 used to adjust the traffic simulator 118). In some embodiments, the system 100 may improve the ability of the traffic simulator 118 to simulate traffic for transportation networks where the traffic density estimation 120 and/or the network flow estimation 122 may initially be relatively poor at simulating real/desired traffic conditions (e.g., because ground-based measurements are not obtainable/included for one or more links). For example, the traffic simulator 118 may be improved (e.g., get closer to simulating real/desired traffic conditions) for transportation networks including one or more links lacking ground-based measurements because the system 100 may include adjusting the traffic simulator based on the observed traffic density 114 and/or the observed network flow 116 determined using the images 102. Thus, in these and other embodiments, the system 100 may provide one or more advantages to calibrating a mesoscopic traffic network model.

Modifications, additions, or omissions may be made to the system 100 without departing from the scope of the disclosure. For example, the designations of different elements in the manner described is meant to help explain concepts described herein and is not limiting. For instance, in some embodiments, the images 102, the vehicle identifying module 104, the segment identifying module 108, the traffic simulator 118, and/or the adjusting module 124 may be delineated in the specific manner described to help with explaining concepts described herein, but such delineations are not meant to be limiting. Further, the system 100 may include any number of other elements or may be implemented within other systems or contexts than those described.

Figure 2:
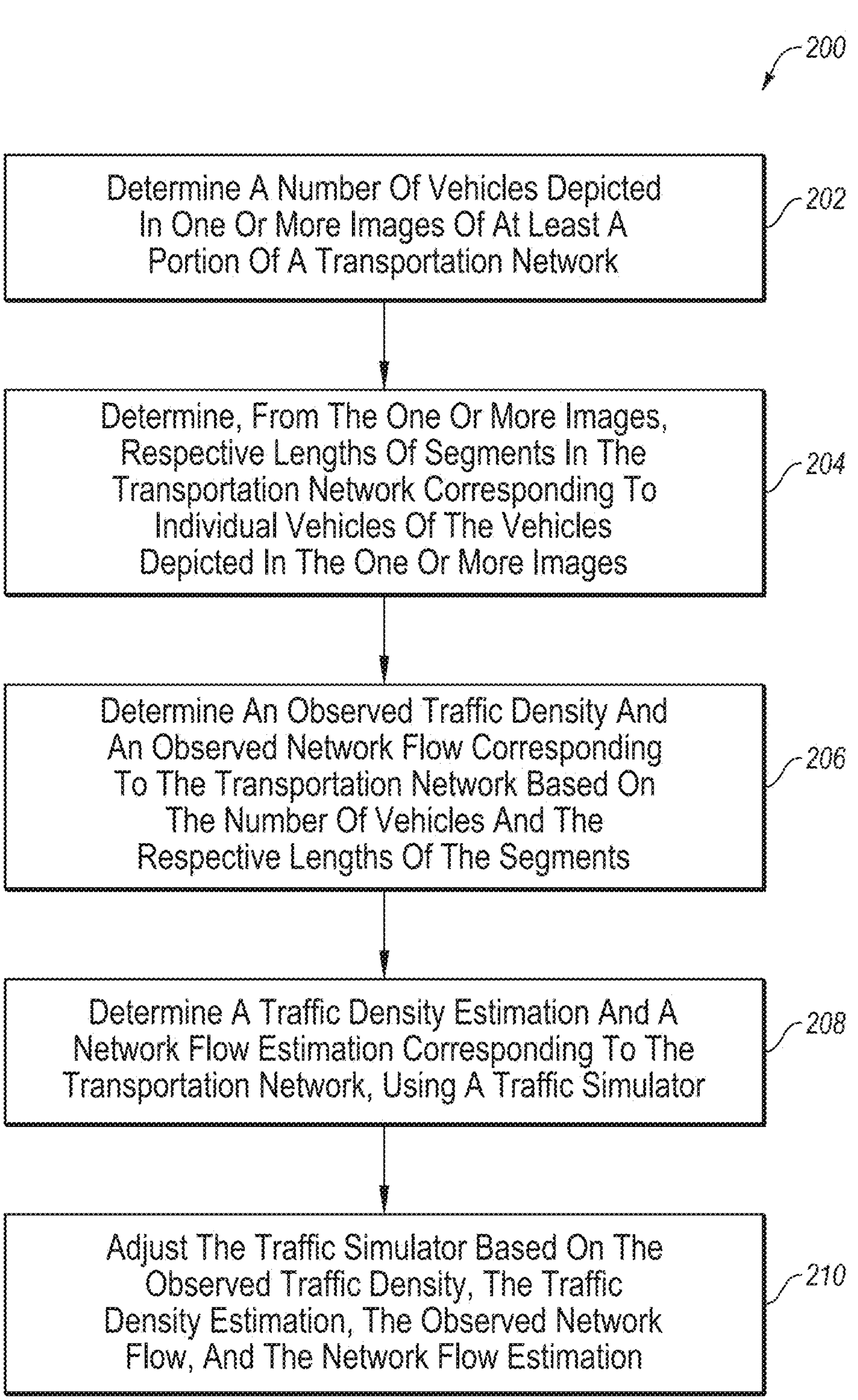
FIG. 2 illustrates a flowchart of an example method of adjusting a traffic simulator.

FIG. 2 is a flowchart of an example method 200 of adjusting a traffic simulator, according to one or more embodiments of the present disclosure. The method 200 may be performed by any suitable system, apparatus, or device. For example, one or more of the operations of the method 200 may be implemented by one or more devices/systems described with respect to FIG. 1A. Additionally or alternatively, one or more operations of the method 200 may be performed by a computing system, such as that described with respect to FIG. 3. Although illustrated with discrete blocks, the steps and operations associated with one or more blocks of the method 200 may be divided into additional blocks, combined into fewer blocks, or eliminated, depending on the particular implementation. In some embodiments, one or more non-transitory computer readable mediums may be configured to store instructions that when executed result in performing the method 200. In some embodiments, the method 200 may be scalable to simulate/analyze the traffic conditions of relatively large transportation networks (e.g., transportation networks of metropolitan areas, regional highway systems, entire countries, etc.), which may assist in providing adjustments/optimization across vast and complex infrastructures.

The method 200 may include block 202. At block 202, the number of vehicles depicted in one or more images of at least a portion of a transportation network may be determined. In some embodiments, one or more of the operations described with respect to the vehicle identifying module 104 of FIG. 1A may be performed as part of block 202.

Additionally or alternatively, the images 102 of FIG. 1A may be an example of the images. In some embodiments, the images may be at least 40-centimeters in resolution. For example, the images may have 30-centimeter resolution, 20-centimeter resolution, 10-centimeter resolution, or higher resolution.

In some embodiments, the images may include one or more overhead images. In these and other embodiments, the overhead images may include satellite images. In some embodiments, satellite images may be captured from outer space using an orbiting satellite. Additionally or alternatively, the overhead image may include one or more aerial images. In some embodiments, aerial images may include an image captured from an airborne perspective such as an aircraft, drone, balloon, etc. In some embodiments, aerial images may include higher resolution images than satellite images and/or other images. In some embodiments, determining the number of vehicles depicted in the image may exclude parked vehicles and/or vehicles not located within the transportation network (e.g., vehicles identified as being in a parking lot, a parking garage, a driveway, a garage, the side of a road, etc.). For example, vehicles more than three lanes away and/or more than 118 feet (36 meters) from centerlines in links identified to be in the transportation network may be excluded.

At block 204, the respective lengths of segments in the transportation network corresponding to individual vehicles of the vehicles depicted in the images may be determined from the images. In some embodiments, the respective lengths of segments may be determined based at least partially on the vehicle type of each vehicle determined to be depicted in the images. In these and other embodiments, one or more operations described with respect to the segment identifying module 108 of FIG. 1A may be performed as part of identifying the lengths of the segments.

At block 206, an observed traffic density and an observed network flow corresponding to the transportation network based on the number of vehicles and the respective lengths of segments may be determined. In some embodiments, determining the observed traffic density and the observed network flow corresponding to the transportation network may include determining the observed traffic density and/or the observed network flow of one or more links in the transportation network without corresponding ground-based traffic measurements. In some embodiments, determining the observed traffic density and/or the observed network flow corresponding to the transportation network may include using one or more computer vision (CV) techniques. For example, determining the observed traffic density and/or the observed network flow may include image classification, object detection, semantic segmentation, instance segmentation, panoptic segmentation, and/or visual simultaneous localization and mapping (SLAM). For example, determining the observed traffic density and/or the observed network flow may include using object detection implemented on sliding windows of a size. In some embodiments, determining the observed traffic density may be based on respective vehicle types as classified. In these and other embodiments, one or more operations described with respect to the CV module 112 of FIG. 1A may be performed as part of determining the observed traffic density and/or the observed network flow.

At block 208, a traffic simulator may be used to determine a traffic density estimation and/or a network flow estimation corresponding to the transportation network. In some embodiments, network flow estimation error, travel time estimation error, and/or traffic density estimation error may be used to determine the traffic density estimation and/or the network flow estimation. In these and other embodiments, one or more operations described with respect to the traffic simulator 118 of FIG. 1A may be performed as part of determining the traffic density estimation and/or the network flow estimation.

At block 210, the traffic simulator may be adjusted based on the observed traffic density, the traffic density estimation, the observed network flow, and/or the network flow estimation. In some embodiments, adjusting a traffic simulator based on the observed traffic density, the traffic density estimation, the observed network flow, and/or the network flow estimation may improve calibration accuracy of the traffic simulator. For instance, links lacking ground-based measurements of traffic flow and/or travel time may benefit from the improved calibration accuracy obtained by using the observed traffic density, the traffic density estimation, the observed network flow, and the network flow estimation to adjust the traffic simulator. In these and other embodiments, one or more operations described with respect to the adjusting module 124 of FIG. 1A may be performed as part of adjusting the traffic simulator.

Modifications, additions, or omissions may be made to the method 200 without departing from the scope of the disclosure. For example, the designations of different elements in the manner described is meant to help explain concepts described herein and is not limiting. Further, the method 200 may include any number of other elements or may be implemented within other systems or contexts than those described.

Figure 3:
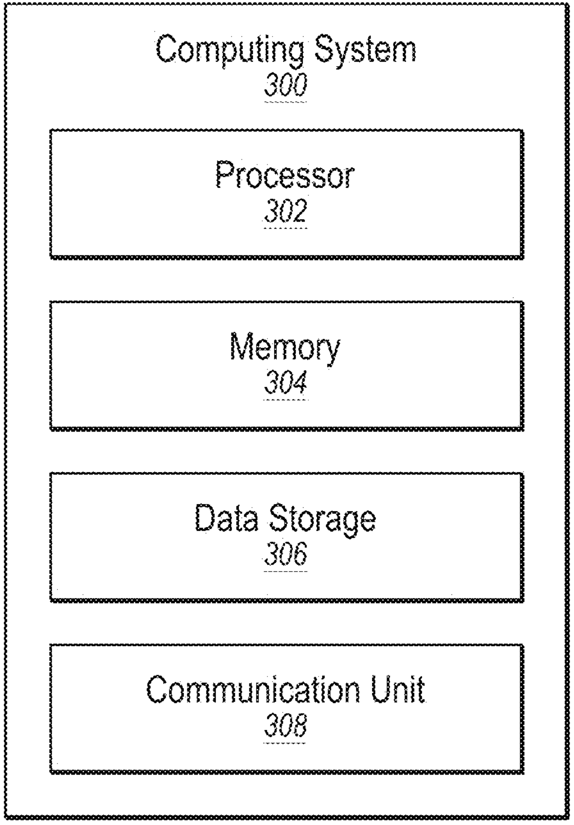
FIG. 3 illustrates a block diagram of an example computing system, all in accordance with one or more embodiments of the present disclosure.

FIG. 3 is an example computing system 300 according to one or more embodiments of the present disclosure. The computing system 300 may include a processor 302, a memory 304, a data storage 306, and/or a communication unit 308, which all or one or more of may be communicatively coupled. For example, the vehicle identifying module 104, the segment identifying module 108, the CV module 112, the traffic simulator 118, and/or the adjusting module 124 of FIG. 1A may be implemented as or configured to utilize a computing system consistent with the computing system 300.

Generally, the processor 302 may include any suitable special-purpose or general-purpose computer, computing entity, or processing device including various computer hardware or software modules and may be configured to execute instructions stored on any applicable computer-readable storage media. For example, the processor 302 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data.

Although illustrated as a single processor in FIG. 3, it is understood that the processor 302 may include any number of processors distributed across any number of network or physical locations that are configured to perform individually or collectively any number of operations described in the present disclosure. In some embodiments, the processor 302 may interpret and/or execute program instructions and/or process data stored in the memory 304, the data storage 306, or the memory 304 and the data storage 306. In some embodiments, the processor 302 may fetch program instructions from the data storage 306 and load the program instructions into the memory 304.

After the program instructions are loaded into the memory 304, the processor 302 may execute the program instructions, such as instructions to cause the computing system 300 to perform some of the operations of the method 200 of FIG. 2. For example, the computing system 300 may execute the program instructions to determine a number of vehicles depicted in one or more images of at least a portion of a transportation network; to determine, from the image, respective lengths of segments in the transportation network corresponding to individual vehicles of the vehicles depicted in the images; to determine an observed traffic density and an observed network flow corresponding to the transportation network based on the number of vehicles and the respective lengths of segments; to determine a traffic density estimation and a network flow estimation, using a traffic simulator; and/or to adjust the traffic simulator based on the observed traffic density, the traffic density estimation, the observed network flow, and/or the network flow estimation of the method 200 of FIG. 2.

The memory 304 and the data storage 306 may include computer-readable storage media or one or more computer-readable storage mediums for having computer-executable instructions or data structures stored thereon. Such computer-readable storage media may be any available media that may be accessed by a general-purpose or special-purpose computer, such as the processor 302. In some embodiments, the computing system 300 may or may not include either of the memory 304 and the data storage 306.

By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to store desired program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause the processor 302 to perform a particular operation or group of operations.

The communication unit 308 may include any component, device, system, or combination thereof that is configured to transmit or receive information over a network. In some embodiments, the communication unit 308 may communicate with other devices at other locations, the same location, or even other components within the same system. For example, the communication unit 308 may include a modem, a network card (wireless or wired), an optical communication device, an infrared communication device, a wireless communication device (such as an antenna), and/or chipset (such as a Bluetooth device, an 802.6 device (e.g., Metropolitan Area Network (MAN)), a WiFi device, a WiMax device, cellular communication facilities, or others), and/or the like. The communication unit 308 may permit data to be exchanged with a network and/or any other devices or systems described in the present disclosure. For example, the communication unit 308 may allow the computing system 300 to communicate with other systems, such as computing devices and/or other networks.

One skilled in the art, after reviewing this disclosure, may recognize that modifications, additions, or omissions may be made to the computing system 300 without departing from the scope of the present disclosure. For example, the computing system 300 may include more or fewer components than those explicitly illustrated and described.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, it may be recognized that changes may be made in form and detail without departing from the scope of the present disclosure. Thus, the present disclosure is limited only by the claims.

In some embodiments, the different components, modules, engines, and services described herein may be implemented as objects or processes that execute on a computing system (e.g., as separate threads). While some of the systems and methods described herein are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A method, comprising:

determining a number of vehicles depicted in one or more images of at least a portion of a transportation network;

classifying each of the vehicles depicted in the one or more images by type of vehicle;

determining, from the one or more images, respective lengths of segments in the transportation network corresponding to each of the vehicles based on average length of the type of vehicle;

determining an observed traffic density and an observed network flow corresponding to the transportation network based on the number of vehicles and the respective lengths of the segments;

determining a traffic density estimation and a network flow estimation corresponding to the transportation network, using a traffic simulator; and adjusting the traffic simulator based on the observed traffic density, the traffic density estimation, the observed network flow, and the network flow estimation.

2. The method of claim 1, wherein the one or more images are at least 30-centimeters in resolution and comprise one or more of aerial images or satellite images.

3. The method of claim 1, wherein the transportation network includes one or more links without corresponding ground-based traffic measurements.

4. The method of claim 1, wherein the determining of the observed traffic density and the observed network flow corresponding to the transportation network comprises using one or more computer vision techniques including one or more of:

image classification, object detection, semantic segmentation, instance segmentation, panoptic segmentation, or visual simultaneous localization and mapping.

5. The method of claim 1, wherein the determining of the observed traffic density and the observed network flow corresponding to the transportation network comprises using object detection implemented on sliding windows of a size.

6. The method of claim 1, wherein the adjusting the traffic simulator comprises:

determining one or more of network flow estimation error, travel time estimation error, or traffic density estimation error.

7. A system, comprising:

one or more processors configured to perform operations comprising:

determining a number of vehicles depicted in one or more images of at least a portion of a transportation network;

classifying each of the vehicles depicted in the one or more images by type of vehicle;

determining an observed traffic density and an observed network flow corresponding to the transportation network based on the number of vehicles depicted in the one or more images and respective lengths of segments in the transportation network corresponding to each of the vehicles based on average length of the type of vehicle; and adjusting one or more of a traffic density estimation or a network flow estimation determined by a traffic simulator based on the observed traffic density and the observed network flow.

8. The system of claim 7, wherein the one or more images are at least 30-centimeters in resolution and comprise one or more of aerial images or satellite images.

9. The system of claim 7, wherein the transportation network includes one or more links without corresponding ground-based traffic measurements.

10. The system of claim 7, wherein the determining of the observed traffic density and the observed network flow comprises using one or more computer vision techniques including one or more of:

image classification,
object detection,
semantic segmentation,
instance segmentation,
panoptic segmentation, or
visual simultaneous localization and mapping.

11. The system of claim 7, wherein the determining of the observed traffic density and the observed network flow comprises using object detection implemented on sliding windows of a size.

12. The system of claim 7, wherein the adjusting the one or more of the traffic density estimation or the network flow estimation determined by the traffic simulator comprises:

determining one or more of network flow estimation error, travel time estimation error, or traffic density estimation error.

13. One or more non-transitory computer-readable storage media configured to store instructions that, in response to being executed, cause a system to perform operations, the operations comprising:

determining a number of vehicles depicted in an image of at least a portion of a transportation network;

classifying each of the vehicles depicted in the image by type of vehicle;

determining, from the image, respective lengths of segments in the transportation network corresponding to each of the vehicles based on average length of the type of vehicle;

determining an observed traffic density and an observed network flow corresponding to the transportation network based on the number of vehicles and the respective lengths of segments;

determining a traffic density estimation and a network flow estimation corresponding to the transportation network, using a traffic simulator; and adjusting the traffic simulator based on the observed traffic density, the traffic density estimation, the observed network flow, and the network flow estimation.

14. The one or more non-transitory computer-readable storage media of claim 13, wherein the image is at least 30-centimeters in resolution and is one or more of an aerial image or a satellite image.

15. The one or more non-transitory computer-readable storage media of claim 13, wherein the transportation network includes one or more links without corresponding ground-based traffic measurements.

16. The one or more non-transitory computer-readable storage media of claim 13, wherein the determining of the observed traffic density and the observed network flow comprises using one or more computer vision techniques including one or more of:

image classification,
object detection,
semantic segmentation,
instance segmentation,
panoptic segmentation, or
visual simultaneous localization and mapping.

17. The one or more non-transitory computer-readable storage media of claim 13, wherein the adjusting the traffic simulator comprises:

determining one or more of network flow estimation error, travel time estimation error, or traffic density estimation error.

* * * * *